United States Patent
Chida et al.

(10) Patent No.: US 8,421,233 B2
(45) Date of Patent: Apr. 16, 2013

(54) SEMICONDUCTOR DEVICE

(75) Inventors: Chikako Chida, Osaka (JP); Fumito Itou, Osaka (JP); Hiroshige Hirano, Nara (JP)

(73) Assignee: Panasonic Corporation, Osaka (JP)

( * ) Notice: Subject to any disclaimer, the term of this patent is extended or adjusted under 35 U.S.C. 154(b) by 469 days.

(21) Appl. No.: 12/753,628

(22) Filed: Apr. 2, 2010

(65) Prior Publication Data

US 2010/0289151 A1   Nov. 18, 2010

(30) Foreign Application Priority Data

May 12, 2009   (JP) .................... 2009-115614

(51) Int. Cl.
*H01L 23/48* (2006.01)
*H01L 23/52* (2006.01)
*H01L 29/40* (2006.01)

(52) U.S. Cl.
USPC ............ 257/773; 257/776; 257/775; 257/774

(58) Field of Classification Search .................. 257/773, 257/776, 775, 774, 567, 208, 203, 211
See application file for complete search history.

(56) References Cited

U.S. PATENT DOCUMENTS

| | | | | |
|---|---|---|---|---|
| 4,970,572 A | * | 11/1990 | Kato et al. | 257/758 |
| 5,117,280 A | * | 5/1992 | Adachi | 257/669 |
| 5,200,807 A | * | 4/1993 | Eguchi | 257/758 |
| 5,365,091 A | | 11/1994 | Yamagishi | |
| 5,402,005 A | * | 3/1995 | Takayama et al. | 257/758 |
| 6,075,292 A | * | 6/2000 | Noguchi | 257/758 |
| 2006/0012029 A1 | * | 1/2006 | Kikuchi et al. | 257/700 |
| 2006/0157825 A1 | | 7/2006 | Umemoto et al. | |
| 2009/0121360 A1 | * | 5/2009 | Takewaki | 257/773 |

FOREIGN PATENT DOCUMENTS

JP   08-097339   4/1996

* cited by examiner

*Primary Examiner* — Chuong A. Luu
(74) *Attorney, Agent, or Firm* — McDermott Will & Emery LLP

(57) ABSTRACT

A semiconductor device includes a lower-layer wire, an upper-layer wire including a wire portion and a first wide portion whose wire width is greater than the wire portion, and a contact formation portion in which a contact portion for connecting the lower-layer wire and the first wide portion with each other is provided. The contact formation portion has a planar shape of which a length L1 in a direction parallel to a wire width direction of the first wide portion is greater than a length L2 in a direction parallel to a wire length direction of the first wide portion.

13 Claims, 8 Drawing Sheets

//!!PAGE_START!!//
SEMICONDUCTOR DEVICE

CROSS-REFERENCE TO RELATED APPLICATION

This application claims priority from Japanese Patent Application JP2009-115614 filed on May 12, 2009, the disclosure of which application is hereby incorporated by reference into this application in its entirety for all purposes.

BACKGROUND

The present disclosure relates to the shape of a connecting portion between wires provided in different wiring layers in a semiconductor integrated circuit.

In a semiconductor integrated circuit, a contact electrically connecting together wires provided in different wiring layers is likely to undergo wire breaking, etc., due to the step between wires or the contact resistance. Therefore, a plurality of contacts are arranged to reduce the resistance, thereby avoiding the occurrence of wire breaking, etc.

FIG. 15 is a plan view showing a connecting portion between wires provided in different wiring layers in a conventional semiconductor device. The conventional semiconductor device includes a semiconductor substrate, a first insulating layer provided on the semiconductor substrate, a wire 103 provided on the first insulating layer, a second insulating layer provided on the wire 103, a bonding pad 101 provided on the second insulating layer, and a wire 102 formed integral therewith. Portions of the wire 102 that are provided in the openings of the second insulating layer each serve as a contact 104 connected to the wire 103. The bonding pad and the wire 102 are formed by aluminum (Al), and the wire 103 is formed by polysilicon. Each contact 104 has a square planar shape.

In the conventional semiconductor device, the connection area of the wire 103, which is used for the electric connection with the wire 102 via the contacts 104, has such a shape that the end portion thereof has an increased width (d2) about several times to some tens of times the wire width (d1) of the other portion and is tapered toward the direction in which the wire 103 extends so that the width gradually becomes equal to the wire width (d1) of the other portion.

Where two wires 102 and 103 are connected with each other via a plurality of contacts 104, the current is concentrated at one or more of the contacts 104 that are located toward the direction in which the wire of the greater wire resistance (the wire 103 in the illustrated example) extends (the rightward direction in FIG. 15; the leading direction of the wire 103). Particularly, the current is concentrated at an end portion of the contact area between the wire 103 and the contact 104 toward the direction in which the wire 103 extends.

For this problem, the conventional semiconductor device includes the wire 103 whose connection area is gradually flared in the hope that the current flows around also to the contacts 104 other than those located toward the direction in which the wire 103 extends.

SUMMARY

However, the present inventors have independently found out that in practice, even if the width of the connection area of the wire 103 is widened, the current still tends to flow through the shortest route, and such an arrangement therefore has only a little effect in reducing the current concentration. Therefore, the possibility of heat generation and wire breaking at the current-concentrating portion is not eliminated, and it is believed that it is difficult to pass a large current through the wires.

One may possibly increase the thickness of the wire 103 or widen the wire 103 in order to prevent such a current concentration, but there is a limit due to the chip size constraint, etc.

With a semiconductor device according to an illustrative embodiment of the present invention, where wires provided in different wiring layers are connected with each other via a contact portion, it is possible to avoid the current concentration at a particular portion of the contact portion.

In order to solve the problem above, an example semiconductor device includes: a first interlayer insulating film provided on a semiconductor substrate; a lower-layer wire provided on the first interlayer insulating film; a second interlayer insulating film provided on the first interlayer insulating film and the lower-layer wire and including an opening over a portion of the lower-layer wire; an upper-layer wire provided on the second interlayer insulating film and including a first wire portion and a first wide portion whose wire width is greater than the first wire portion; and a contact formation portion formed in the opening and including at least one contact portion for connecting the lower-layer wire and the first wide portion with each other, wherein the contact formation portion has a planar shape of which a length in a direction parallel to a wire width direction of the first wide portion is greater than a length in a direction parallel to a wire length direction of the first wide portion.

With such a configuration, the upper-layer wire includes the first wide portion for the connection with the lower-layer wire via the contact portion, and the contact formation portion has a planar shape of which the length in the direction parallel to the wire width direction of the first wide portion is greater than the length in the direction parallel to the wire length direction of the first wide portion. Therefore, it is possible to reduce the current concentration at a portion of the contact portion as compared with the conventional semiconductor device. Therefore, heat generation and wire breaking at the contact portion are reduced, and it is therefore possible to improve the reliability as compared with the conventional semiconductor device. Moreover, since it is not necessary to increase the thickness of the lower-layer wire and that of the upper-layer wire or to increase the overall wire width of the lower-layer wire and that of the upper-layer wire, it is possible to improve the reliability while suppressing the increase in the area.

The upper-layer wire may be provided on the second interlayer insulating film, and the contact portion may be a portion of the upper-layer wire.

It is preferred that the first wide portion is provided in an end portion of the upper-layer wire, and a second distance is greater than a first distance, where the first distance denotes a planar distance between the contact formation portion and a wire end of the upper-layer wire, and the second distance denotes a shortest planar distance from a boundary between the first wire portion and the first wide portion to the contact formation portion. If the first distance is sufficient, it is possible to spread the current in the longitudinal direction of the contact portion, and it is therefore possible to effectively reduce the electric field concentration.

It is preferred that a third distance is less than 1.7 times a second distance, where the second distance denotes a shortest planar distance from a center point of a boundary between the first wire portion and the first wide portion to the contact formation portion, and the third distance denotes a longest planar distance from the center point of the boundary between the first wire portion and the first wide portion to a portion of the contact formation portion that is facing the first wire portion.

A plurality of the contact portions may be arranged in the contact formation portion, the contact portions having a generally equal rectangular planar shape.

The contact portion may have an octagonal planar shape obtained by chamfering corner portions.

A width of the first wide portion may be flared toward the contact formation portion from a boundary between the first wide portion and the first wire portion, and where a first direction denotes one of opposite wire width directions of the first wide portion, a slope starting from one end point of a boundary between the first wide portion and the first wire portion in the first direction may lie outside a line extending from the end point of the boundary between the first wide portion and the first wire portion to one end point of the contact formation portion in the first direction.

The lower-layer wire may be connected to a second wire portion and the contact portion and include a second wide portion whose wire width is greater than the second wire portion.

A direction in which the second wide portion extends may be generally parallel to a direction in which the first wide portion extends. In such a case, the direction of the current flow through the first wide portion and the direction of the current flow through the second wide portion may be the same direction or opposite directions.

The second wire portion may be extending in a direction bent from the second wide portion, and a portion of the second wide portion may be divided into a plurality of wire portions by means of a plurality of insulating films arranged at an interval in the wire width direction.

The contact formation portion may have a rectangular planar shape, or may have an arc-like or elliptic planar shape.

A wire resistance of the upper-layer wire may be greater than a wire resistance of the lower-layer wire.

A plurality of the lower-layer wires may be provided on the first interlayer insulating film, a plurality of the upper-layer wires may be provided on the second interlayer insulating film, each upper-layer wire being connected to a corresponding lower-layer wire via the contact portion, and connecting portions between the upper-layer wires each including the first wide portion and the lower-layer wires may be arranged in a staggered pattern as viewed from above the semiconductor substrate.

As described above, with the example semiconductor device, it is possible to effectively reduce the current concentration at a portion of the contact portion as compared with the conventional semiconductor device.

DETAILED DESCRIPTION

Embodiments of the present invention will now be described with reference to the drawings.

First Embodiment

Figure 1:
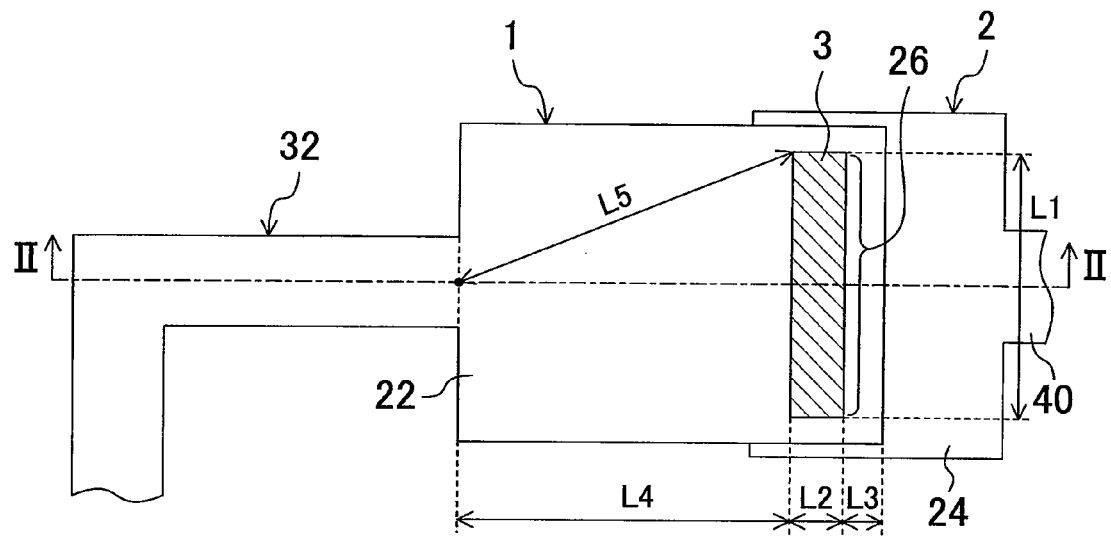
FIG. 1 is a plan view showing a connection structure between two wires provided in vertically-adjacent wiring layers in a semiconductor device according to a first embodiment of the present invention.
Figure 2:
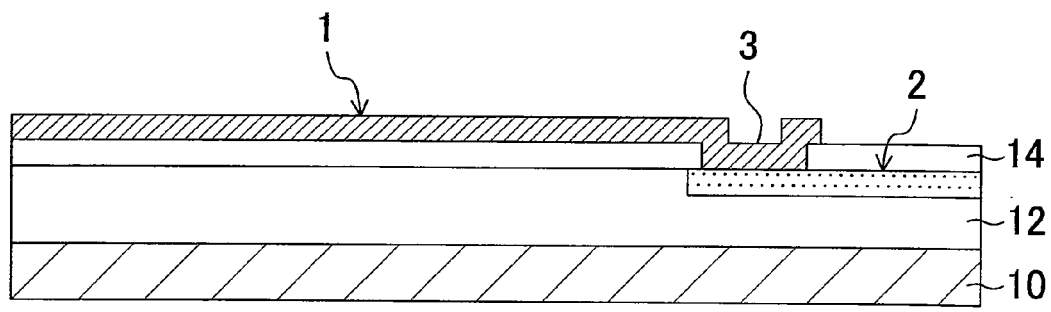
FIG. 2 is a cross-sectional view of the semiconductor device of the first embodiment taken along line II-II of FIG. 1.
Figure 3:
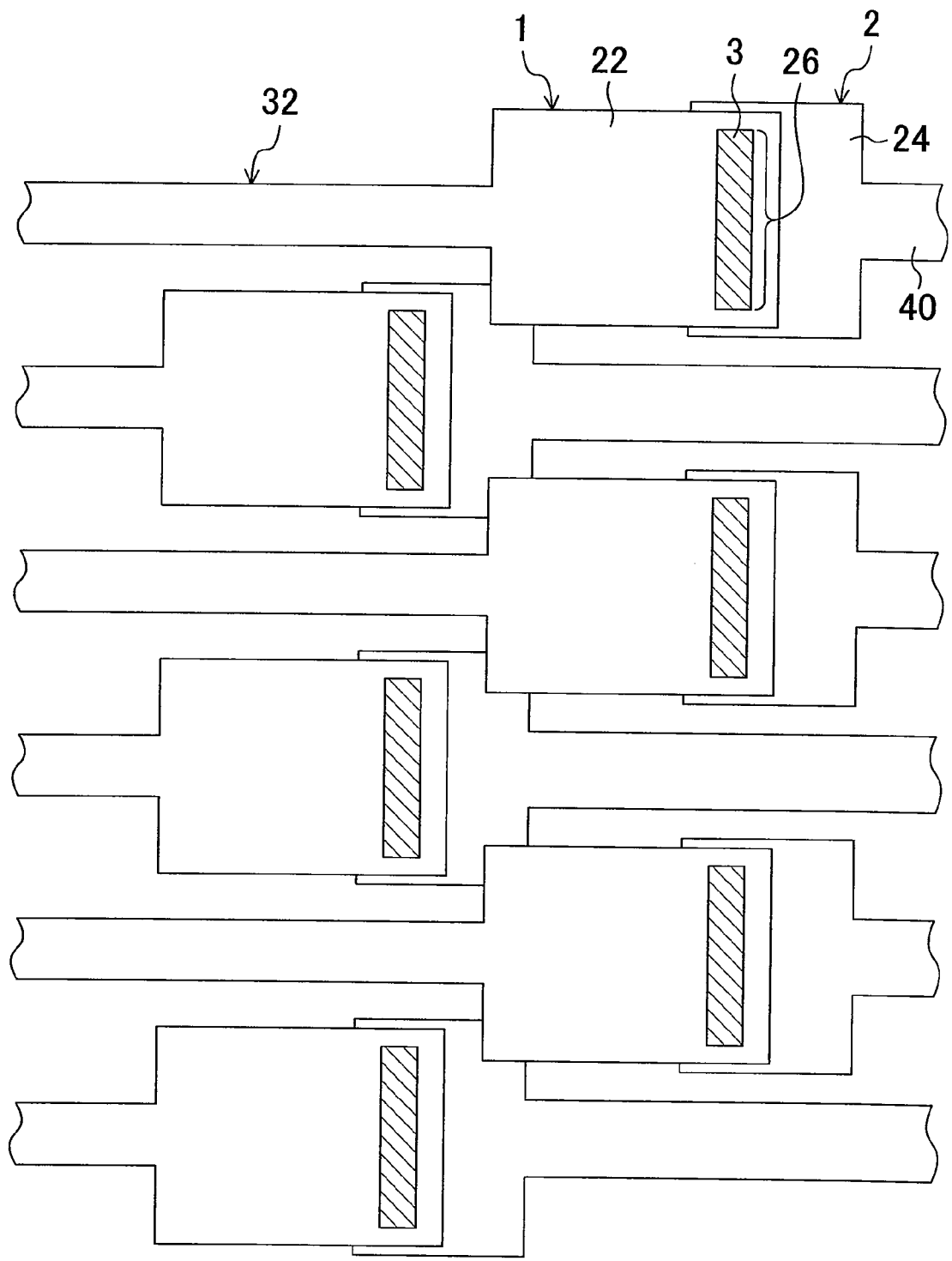
FIG. 3 is a plan view showing a plurality of connection structures in the semiconductor device of the first embodiment.
Figure 4:
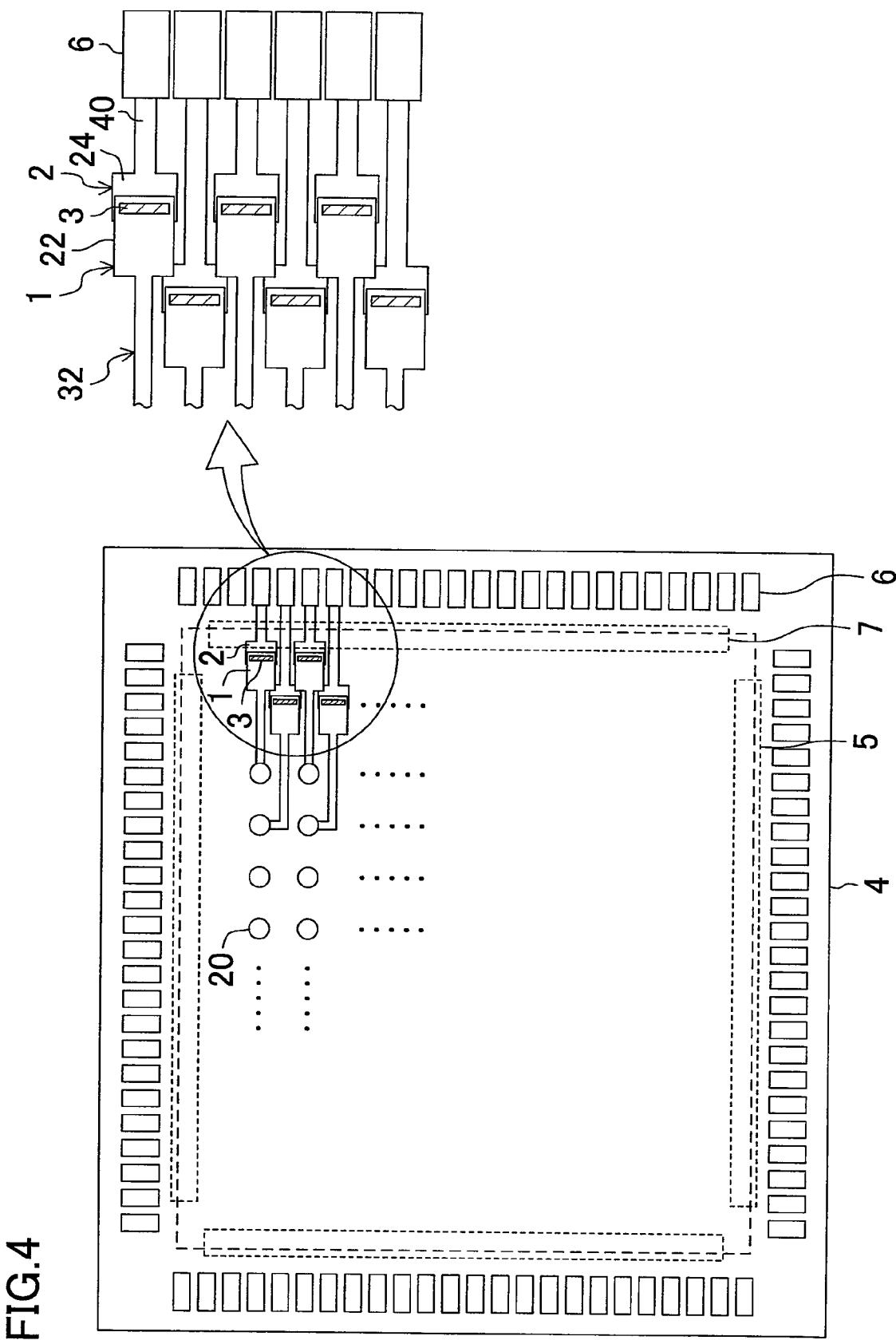
FIG. 4 is a plan view showing an example configuration of a semiconductor device, which is a semiconductor chip, including a wire connection structure of the first embodiment.

FIG. 1 is a plan view showing a connection structure between two wires provided in vertically-adjacent wiring layers in a semiconductor device according to a first embodiment of the present invention, and FIG. 2 is a cross-sectional view of the semiconductor device taken along line II-II of FIG. 1. FIG. 3 is a plan view showing a plurality of connection structures in a semiconductor device of the present embodiment, and FIG. 4 shows an example configuration of a semiconductor device, which is a semiconductor chip, including a structure shown in FIGS. 1-3. Note that FIGS. 1 and 3 do not show an insulating film (the second interlayer insulating film) between a lower-layer wire 2 and an upper-layer wire 1 for ease of understanding. In the following description, the "contact formation portion" means the entire portion where one or more contact portions 3, which are connecting portions between the lower-layer wire 2 and the upper-layer wire 1, are provided. The "contact portion" as used herein means a member for connecting together wires in different wiring layers, and includes what is known as a "contact plug," a "via plug," etc. The "wire width direction" of a wire refers to, unless otherwise specified, a direction that is perpendicular to the direction of the current flow through the wire as viewed from above the semiconductor substrate. The "wire length direction" of a wire refers to, unless otherwise specified, a direction that is parallel to the direction of the current flow through the wire as viewed from above the semiconductor substrate.

As shown in FIGS. 1 and 2, the semiconductor device of the present embodiment includes a semiconductor substrate 10 on which various semiconductor elements are provided, a first interlayer insulating film 12 provided on the semiconductor substrate 10, the lower-layer wire 2 buried in an upper portion of the first interlayer insulating film 12, a second interlayer insulating film 14 provided on the first interlayer insulating film 12 and the lower-layer wire 2 with an opening over a portion of the lower-layer wire 2, and the upper-layer wire 1 provided on the second interlayer insulating film 14 and connected to the lower-layer wire 2 via a contact portion 3 formed in the opening in a contact formation portion 26.

The upper-layer wire 1 is connected to, for example, an area pad, or the like, and includes a first wide portion 22 whose wire width is greater than the other portion (a wire portion 32) and which is to be electrically connected to the lower-layer wire 2 via the contact portion 3. For example, the lower-layer wire 2 is connected to an input/output circuit, etc., as will be described later, and includes a second wide portion 24 whose wire width is greater than the other portion (a wire portion 40) and which is to be connected to the contact portion 3. The first wide portion 22 and the second wide portion 24 are provided so as to partially overlap with each other, including the contact formation portion 26 as viewed from above the semiconductor substrate 10. In the example shown in FIG. 1, only one contact portion 3 is provided in the contact formation portion 26. Therefore, in the present embodiment, the length and the width of the planar shape of the contact formation portion 26 are L1 and L2, respectively, equal to those of the contact portion 3. The contact portion 3 as used herein refers to the entire portion that is in contact with the lower-layer wire 2. Herein, the direction parallel to a side of the contact formation portion 26 having the length L1 (the longitudinal direction) is the wire width direction of the first wide portion 22 and the second wide portion 24, and the direction parallel to a side of the contact formation portion 26 having the width L2 (the transverse direction) is the wire length direction of the first wide portion 22 and the second wide portion 24. The direction in which the wire portion 32 extends from the first wide portion 22 in the upper-layer wire 1 is the transverse direction of the contact formation portion 26, and is parallel to the direction in which the wire portion 40 extends from the second wide portion 24 in the lower-layer wire 2. Therefore, the wire portion 32 and the wire portion 40 extend in opposite directions along the transverse direction with the contact formation portion 26 interposed therebetween.

In the example of the present embodiment, the lower-layer wire 2 is a copper (Cu) wire and the upper-layer wire 1 is an aluminum (Al) wire, and the wire resistance of a portion of the lower-layer wire 2 excluding the second wide portion 24 is lower than the wire resistance of a portion of the upper-layer wire 1 excluding the first wide portion 22.

Where the upper-layer wire 1 is formed by Al as is in the present embodiment, the contact portion 3 is also formed by Al, and the contact portion 3 is formed simultaneously and integrally with the upper-layer wire 1. That is, a portion of the upper-layer wire 1 that is present in the opening of the second interlayer insulating film 14 over the lower-layer wire 2 serves as the contact portion 3.

In the semiconductor device of the present embodiment, the contact formation portion 26, where the contact portion 3 is provided, has a generally rectangular planar shape of which the length L1 in the direction parallel to the wire width direction of the first wide portion 22 (the vertical direction in FIG. 1; the direction perpendicular to center line II-II of the first wide portion 22) is greater than the length (width) L2 thereof in the direction parallel to the wire length direction of the first wide portion 22. In the upper-layer wire 1, the shortest planar distance L4 from the center of the boundary between the normal-width wire portion 32 and the first wide portion 22 to the contact portion 3 (the contact formation portion 26) is sufficient for the current flow through the first wide portion 22 to spread across the entire contact portion 3, as will be described below. Note that L5 shown in FIG. 1 represents the longest planar distance from the center of the boundary between the wire portion 32 and the first wide portion 22 to a portion of the contact portion 3 (the contact formation portion 26) that is facing the wire portion 32, and L3 represents the width of the margin portion for forming the contact portion 3 in the second wide portion 24, i.e., the planar distance from the wire end of the upper-layer wire 1 to the contact portion 3 (the contact formation portion 26).

Specifically, the thickness of the lower-layer wire 2 is about 0.2 μm-2 μm, and the thickness of the upper-layer wire 1 is about 0.4 μm-2 μm. The wire width of the upper-layer wire 1 is about 5 μm-10 μm, and the wire width of the lower-layer wire 2 is about 50 nm-10 μm. It is preferred that the depth of the contact portion 3 of the upper-layer wire 1 connected to the lower-layer wire 2 (generally equal to the thickness of the second interlayer insulating film 14 in the illustrated example) is about 0.3 μm-0.6 μm.

Here, if the depth of the contact portion 3 is excessive, it reduces the coverage of Al in the boundary portion between the contact portion 3 and the first wide portion 22, and reduces the thickness of the boundary portion. Then, with the conventional configuration, heat generation and wire breaking are likely to occur in the boundary portion when the current flows therethrough, thereby lowering the reliability, and thus resulting in a limit to the amount of current that can be passed therethrough. In order to pass a large amount of current across the entire connecting portion between the lower-layer wire 2 and the upper-layer wire 1, it is important to employ such a configuration that the current is not concentrated at a portion of a side of the contact portion 3.

With the semiconductor device of the present embodiment, for the planar shape of the contact formation portion 26, the length L1 in the direction parallel to the wire width direction of the first wide portion 22 is greater than the length (width) L2 in the direction parallel to the wire length direction of the first wide portion 22 by a factor of about 2-7, for example. Moreover, a predetermined length is reserved for the shortest planar distance L4 from the center of the boundary between the normal-width wire portion 32 and the first wide portion 22 to the contact portion 3. Therefore, when a current flows from the upper-layer wire 1 to the lower-layer wire 2, the current flow entering the first wide portion 22 can be widened in the left-right direction with respect to the current flow direction (the vertical direction in FIG. 1). Therefore, as compared with a case where L4 is short, the concentration of the current at a portion of the contact portion 3 is reduced, and the current flow is widened in the longitudinal direction of the contact portion 3. As a result, heat generation and wire breaking are less likely to occur due to current concentration as compared with the conventional configuration. Therefore, as compared with the conventional semiconductor device, the semiconductor device of the present embodiment can carry a larger current flow between two wires, and the occurrence of wire breaking, etc., is reduced, thus improving the reliability.

In the present embodiment, it is preferred that L1 is 20 μm or more and 50 μm or less, for example, and L2 is 3 μm or more and 10 μm or less, which is the minimum size for feasible processing. It is preferred that L3 is about 2 μm, which is the length required for processing the upper-layer wire 1 including the contact portion 3, and L4 is 15 μm or more and 30 μm or less, for example. It is preferred that L4 is greater than L3. It is particularly preferred that L5 is greater than L4 by a factor of 1.0 or more and 1.7 or less. Even if L5 is greater than 1.7 times L4, the current concentration is reduced as compared with the conventional semiconductor device. However, if L5 is less than or equal to 1.7 times L4, the current flow through the first wide portion 22 can be transmitted while being sufficiently widened in the longitudinal direction of the contact portion 3, and it is therefore possible to more sufficiently provide the advantage of the configuration of the present embodiment. Note that there are cases where the current flows from the lower-layer wire 2 to the upper-layer wire 1, and also in such cases, the current is concentrated at a side of the contact portion 3 that is closer to the boundary between the wire portion 32 and the first wide portion 22 of the upper-layer wire 1. Therefore, with the configuration of the present embodiment, it is possible to effectively reduce the concentration of the current. Note that in the present embodiment, L5 is greater than L4 since the planar shape of the contact formation portion 26 is rectangular.

As will be described in a later embodiment, if the resistance of the lower-layer wire 2 is lower than the resistance of the upper-layer wire, there is unlikely an influence of the current-leading direction. However, if the resistance of the lower-layer wire 2 is high, the leading direction is preferably that of the lower-layer wire in order to avoid the current concentration at the contact portion 3.

FIG. 3 shows an example where there are a plurality of two-wire connection structures described above with reference to FIGS. 1 and 2. As shown in the figure, a plurality of lower-layer wires 2 are in a first wiring layer formed on a semiconductor substrate (not shown), and a plurality of upper-layer wires 1 are provided in a second wiring layer immediately above the first wiring layer. In such a case, connection structures for connecting the lower-layer wires 2 with the corresponding upper-layer wires 1 may be arranged in a single row, but they may alternatively be arranged in a staggered pattern, as shown in FIG. 3, if it is necessary to reduce the lead wire interval of adjacent wiring layers.

FIG. 4 shows an example of a semiconductor device in which the wire connection structure of the present embodiment is formed on a semiconductor chip 4. In the example shown in the figure, an internal circuit where integrated circuits, etc., are provided is formed in a region including the central portion of the upper surface of the semiconductor chip 4, and a plurality of input/output circuits 6 or (and) pads are provided along sides of the semiconductor chip 4 in the peripheral portion of the upper surface. A circuit formation section (internal circuit) 5 is placed inside the input/output circuits 6 in the peripheral portion of the upper surface of the semiconductor chip 4. A plurality of area pads 20 used for the flip-chip connection, etc., are provided above the region including the circuit formation section 5. In FIG. 4, reference numeral 7 denotes a wiring layer transitioning section.

In the example of FIG. 4, the lower-layer wire 2 is used as a signal line connected to the input/output circuit 6, and is connected to the upper-layer wire 1 via the upper-layer contact portion 3 near the wiring layer transitioning section 7. The upper-layer wire 1 is connected to the area pad 20, for example. The configuration may be such that the lower-layer wire 2, which is connected to the input/output circuit 6, is connected to the upper-layer wire 1, which is connected to the circuit formation section 5. Then, such a staggered pattern as shown in FIG. 3 is used for the wire connection structure, it is possible to reduce the wire interval as compared with a case where the connection structures are arranged in a single row, thereby reducing the area required for the wiring and decreasing the size of the semiconductor chip 4. Moreover, it is possible to improve the connection reliability between two wires in different wiring layers without increasing the wire width for the entire wiring.

While the lower-layer wire 2 is a Cu wire and the upper-layer wire 1 is an Al wire in the example described above, the lower-layer wire 2 and the upper-layer wire 1 may both be a Cu wire or an Al wire. Where the lower-layer wire 2 is an Al wire, the lower-layer wire 2 is provided on the first interlayer insulating film 12 (see FIG. 2).

The lower-layer wire 2 may be an Al wire and the upper-layer wire 1 may be a Cu wire. In such a case, the wire resistance of the lower-layer wire 2 is greater than the wire resistance of the upper-layer wire 1, and the current is concentrated at one side of the connecting portion between the contact portion 3 and the lower-layer wire 2 that is facing the boundary between the second wide portion 24 and the wire portion. Therefore, the distance from the center of the boundary to the contact portion 3 needs to be greater than or equal to a predetermined distance.

Note that in the semiconductor device of the present embodiment, since the current is concentrated at one side of the connecting portion between the contact portion 3 and the first wide portion 22 that is facing the boundary between the first wide portion 22 and the wire portion 32 of the upper-layer wire 1, the length L4 (see FIG. 1) may be set to be greater than or equal to a predetermined length. For example, if L4 is set so that L5 is less than or equal to 1.7 times L4, as described above, the reliability is not deteriorated even if the shortest planar distance from the boundary between the second wide portion 24 and the wire portion 40 of the lower-layer wire 2 to the contact portion 3 is set to be shorter than L4, and it is therefore possible to suppress the increase in chip size.

While the wire width of the second wide portion 24 may be generally equal to or less than the wire width of the first wide portion 22, it is preferred that it is at least greater than or equal to the length L1 of the contact formation portion 26 in the longitudinal direction, in which case the entire contact portion 3 can be in contact with the second wide portion 24.

The wire connection structure described above can be implemented by a combination of known wire formation processes.

Variation of Semiconductor Device of Present Embodiment

Figure 5:
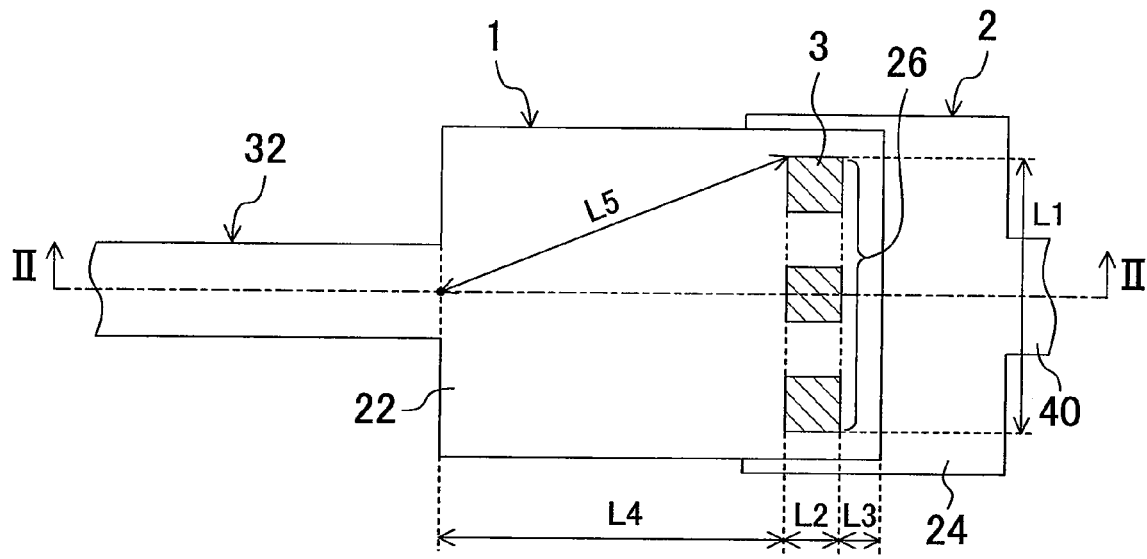
FIG. 5 is a plan view showing a connection structure between two wires provided in vertically-adjacent wiring layers in a semiconductor device according to a first variation of the first embodiment.

FIG. 5 is a plan view showing a connection structure between two wires provided in vertically-adjacent wiring layers in a semiconductor device according to a first variation of the first embodiment. The cross section along line II-II of this variation is similar to that of the semiconductor device of the first embodiment shown in FIG. 2.

In the semiconductor device of the first variation of the first embodiment shown in FIG. 5, a plurality of contact portions 3 of the same shape are formed in a single contact formation portion 26. The planar shape of each contact portion 3 is a generally square shape, for example. Here, the contact formation portion 26 has a generally rectangular planar shape of which the longitudinal dimension is the length L1 from a contact portion 3 located at one end of the contact formation portion 26 in the direction parallel to the wire width direction of the first wide portion 22 to another contact portion 3 located at the opposite end, and of which the transverse dimension is the length (width) L2 of the contact portion 3 in the direction parallel to the wire length direction of the first wide portion 22 (the direction of the central axis II-II line of the first wide portion 22).

With the contact portions 3 having the same square planar shape, it is possible to realize a uniform contact size across the entire semiconductor chip, and to stably and precisely process the contact portions 3. Since L1 of the contact formation portion 26 where a plurality of the contact portions 3 are provided is longer than L2, it is possible to reduce the current concentration at a particular side of a particular contact portion 3. As compared with the example shown in FIG. 1, the processing can be done more stably and precisely, and it is therefore possible to reduce the margin for forming the contact portion 3.

While FIG. 5 shows an example where three contact portions 3 are formed in the contact formation portion 26, the number and size of contact portions 3 may be changed appropriately according to the amount of current to be passed therethrough. For example, L1 may be set to 48 µm, and about ten contact portions 3 may be arranged at a pitch of 5 µm, each contact portion 3 having a 3 µm by 3 µm planar shape.

Note that the correlations between L1-L5 may be set to be similar to those of the first embodiment.

While the planar shape of the contact portion 3 is a generally square shape in the illustrated example, the contact portions 3 can be processed stably also when the planar shape thereof is a generally oblong rectangular shape.

Figure 6:
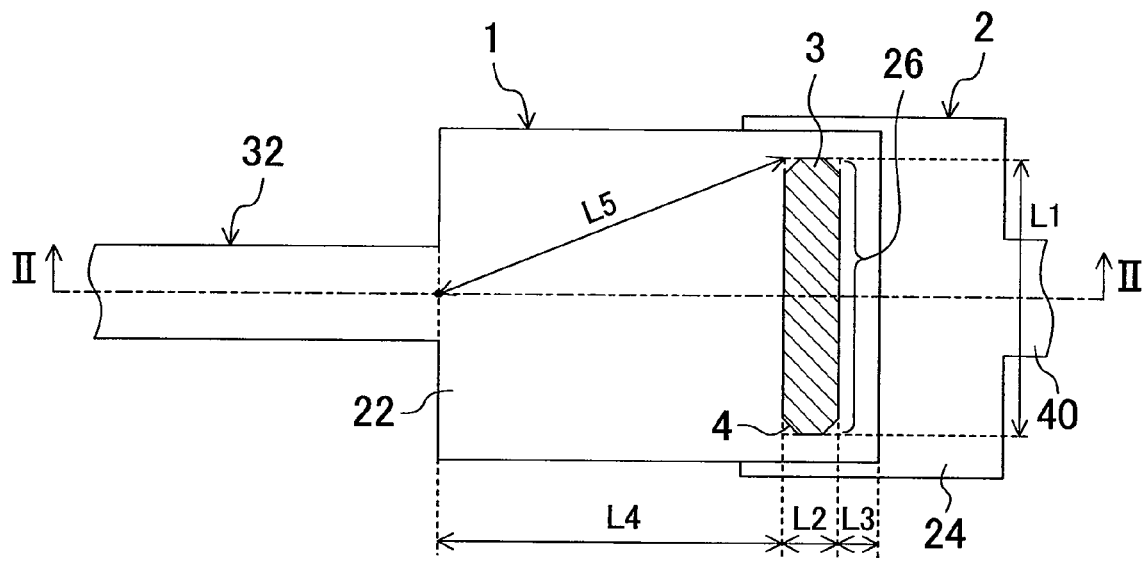
FIG. 6 is a plan view showing a connection structure between two wires provided in vertically-adjacent wiring layers in a semiconductor device according to a second variation of the first embodiment.

FIG. 6 is a plan view showing a connection structure between two wires provided in vertically-adjacent wiring layers in a semiconductor device according to a second variation of the first embodiment. The cross section along line II-II of this variation is similar to that of the semiconductor device of the first embodiment shown in FIG. 2.

While the planar shape of the contact portion 3 of the semiconductor device shown in FIG. 1 is an oblong rectangular shape, the planar shape of the contact portion 3 of the semiconductor device according to the second variation of the first embodiment shown in FIG. 6 is a shape obtained by chamfering the corners thereof. While the chamfer angle is not limited to any particular angle, it may be 45 degrees, for example.

As shown in FIG. 2, a step is formed at the boundary between the contact portion 3 and the first wide portion 22. Particularly, at the corner portions of the contact portion 3, step portions of two different directions (the longitudinal direction and the transverse direction) come into contact with each other, whereby the coverage of the upper-layer wire 1 of Al, for example, may be very poor, and the conductivity reliability for the current flow through this portion may be lowered.

The semiconductor device of this variation has a structure where the corner portions of the contact portion 3 are chamfered by 45 degrees, for example, so as to further improve the coverage of the wire material therein. Thus, the planar shape of the contact portion 3 is a generally octagonal shape. With such a configuration, it is possible to improve the conductivity reliability for the contact portion 3 as a whole. Note that the relationship between L1-L5 shown in FIG. 6 may be set to be similar to those with the semiconductor device of the first embodiment shown in FIG. 1.

Note that also in a case where a plurality of contact portions 3 are provided in the contact formation portion 26 in a semiconductor device of a second embodiment to be described below, it is possible to further improve the conductivity reliability by chamfering the corner portions of each contact portion 3.

Figure 7:
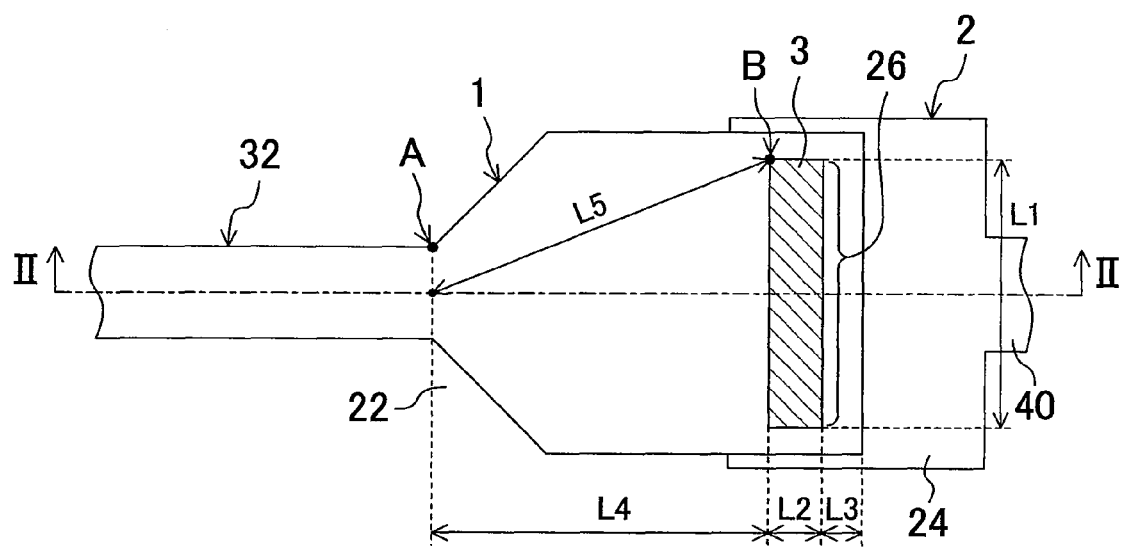
FIG. 7 is a plan view showing a connection structure between two wires provided in vertically-adjacent wiring layers in a semiconductor device according to a third variation of the first embodiment.

FIG. 7 is a plan view showing a connection structure between two wires provided in vertically-adjacent wiring layers in a semiconductor device according to a third variation of the first embodiment. The cross section along line II-II of this variation is similar to that of the semiconductor device of the first embodiment shown in FIG. 2.

While the wire width of the first wide portion 22 is constant in the semiconductor device of the first embodiment, the wire width of the first wide portion 22 gradually increases from the boundary portion with the wire portion (the normal wire width portion) 32 toward the contact formation portion 26 in the semiconductor device of this variation.

Here, it is preferred that the planar shape of the first wide portion 22 is such that the slope starting from one end point A of the boundary between the wire portion 32 and the first wide portion 22 in one direction (the first direction) along the wire width direction (see FIG. 7) lies outside of the line extending from the end point A to an end point B of the contact formation portion 26 in the first direction, in which case the current flowing from the wire portion 32 can spread across the contact portion 3. This preferably applies similarly to the other slope starting from an end point (corner portion) of the boundary between the wire portion 32 and the first wide portion 22 in the other direction (the second direction) along the wire width direction. FIG. 7 shows an example where the slope forms an angle of 45 degrees with respect to the direction in which the wire portion 32 extends.

Substantially no current flows outside the line extending from an end point of the boundary between the wire portion 32 and the first wide portion 22 to a corresponding end point of the contact formation portion 26, as viewed from above. Therefore, even if one employs a configuration with a slope starting from an end point of the boundary, it will not substantially influence the current path.

With the configuration of this variation, wire connecting portions shown in FIG. 7 may be arranged in a staggered pattern, or other signal lines may be arranged in the corner portions of the first wide portion 22, which is cut out more as compared with the example of FIG. 1, so as to reduce the layout area.

Second Embodiment

Figure 8:
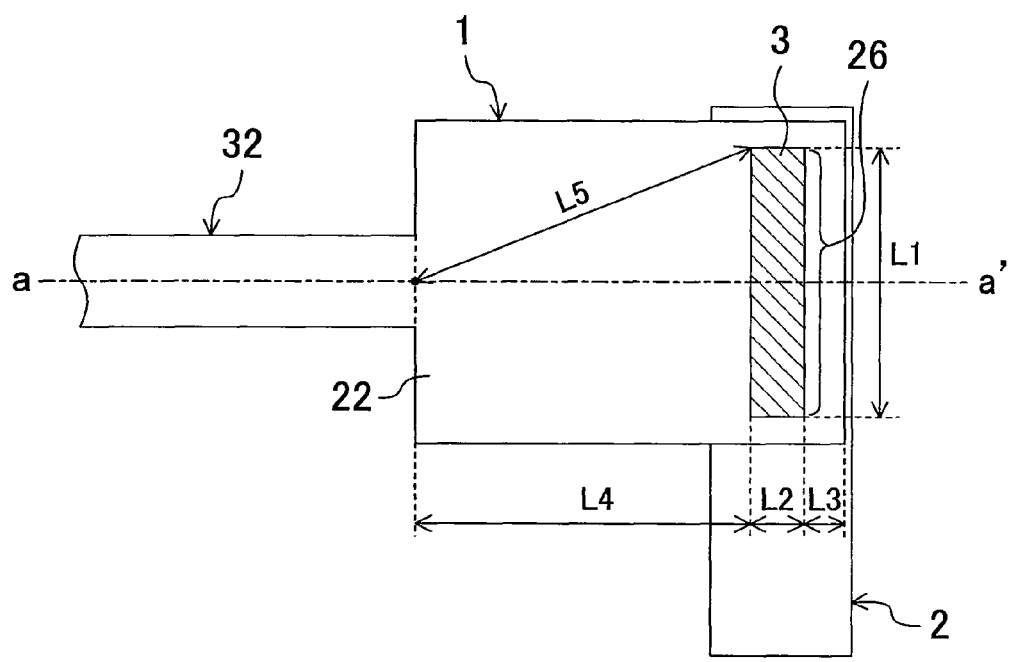
FIG. 8 is a plan view showing a connection structure between two wires provided in vertically-adjacent wiring layers in a semiconductor device according to a second embodiment of the present invention.

FIG. 8 is a plan view showing a connection structure between two wires provided in vertically-adjacent wiring layers in a semiconductor device according to a second embodiment of the present invention. Note that line a-a' in the figure represents the center line of the first wide portion 22 parallel to the transverse direction of the contact formation portion 26.

While the upper-layer wire 1 and the lower-layer wire 2 are arranged in the semiconductor device of the first embodiment so that the direction of the current flow is generally equal therebetween, the direction of the current flow through the upper-layer wire 1 and that through the lower-layer wire 2 are different from each other in the semiconductor device of the present embodiment.

In the example shown in FIG. 8, the direction of the current flow through the upper-layer wire 1 and the direction of the current flow through the lower-layer wire 2 are generally perpendicular to each other as viewed from above. Specifically, although the shape of the upper-layer wire 1 is similar to that of the semiconductor device of the first embodiment, the lower-layer wire 2 extends in a direction perpendicular to the upper-layer wire 1 from where the lower-layer wire 2 is connected to the upper-layer wire 1 via the contact portion 3.

Depending on the layout of the semiconductor device, it may be difficult to lead the current flowing through the upper-layer wire 1 in the same direction by means of the lower-layer wire 2, for example. Even in such a case, with the wire connection structure of the present embodiment, the current flow through the connecting portion between the contact portion 3 and the first wide portion 22 can be made more uniform in the longitudinal direction as compared with the conventional semiconductor device, thereby reducing the current concentration. Note that the lower-layer wire 2 extends in the downward direction shown in FIG. 8 to be connected to an input/output circuit, etc.

With the connection configuration of the present embodiment, the direction of the current flow through the lower-layer wire 2 coincides with the longitudinal direction of the contact portion 3, and the current is therefore more likely to be concentrated at one end of the contact portion 3 that is further away from the end portion of the lower-layer wire 2 in the longitudinal direction (the downward direction in FIG. 8) as compared with the semiconductor device of the first embodiment. However, no particular problem occurs since the current is unlikely to be concentrated at the portion of the contact portion 3 if the wire resistance of the lower-layer wire 2 is lower than the wire resistance of the upper-layer wire 1.

With such a configuration, there is a higher degree of freedom in the arrangement of the lower-layer wire 2, and it is possible to reduce the wiring layout area.

Variation of Semiconductor Device of Present Embodiment

Figure 9:
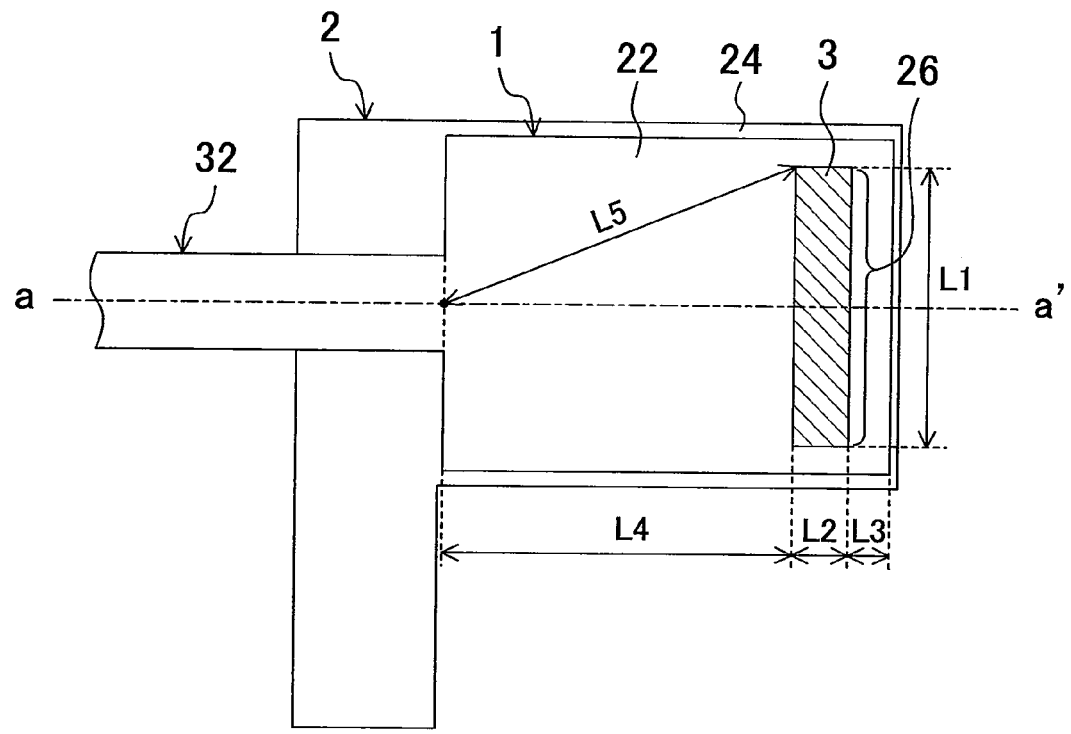
FIG. 9 is a plan view showing a connection structure between two wires provided in vertically-adjacent wiring layers in a semiconductor device according to a variation of the second embodiment.

FIG. 9 is a plan view showing a connection structure between two wires provided in vertically-adjacent wiring layers in a semiconductor device according to a variation of the second embodiment.

In the semiconductor device shown in the figure, the direction of the current flow through the second wide portion 24, which is for the connection with the contact portion 3, is opposite to the direction of the current flow through the upper-layer wire 1. That is, the direction in which the second wide portion 24 extends is parallel to the direction in which the first wide portion 22 extends, and they are extending in the same transverse direction as viewed from the contact formation portion 26, where the wire portion 32 is extending in the transverse direction of the contact formation portion 26 from the first wide portion 22, whereas the wire portion 40 is extending in the longitudinal direction of the contact formation portion 26 from the second wide portion 24.

The size of the first wide portion 22 of the upper-layer wire 1, the size of the contact portion 3, etc., are similar to those of the semiconductor device of the first embodiment, and the width of the second wide portion 24 (the length in the vertical direction of FIG. 9) is greater than or equal to the length of the contact formation portion 26. In a case where the wire resistance of the lower-layer wire 2 is greater than the wire resistance of the upper-layer wire 1, it is preferred to ensure a sufficient length of the second wide portion 24 (the length in the left-right direction in FIG. 9) and to pass a current flow as uniformly as possible across the entire contact portion 3.

With the connection configuration of this variation, it is possible to improve the degree of freedom in the layout of the lower-layer wire 2, and it is therefore possible to reduce the wiring layout area. Since the configuration of this variation can be used irrespective of the relationship between the wire resistance of the lower-layer wire 2 and the wire resistance of the upper-layer wire 1, it is more widely applicable as compared with the wire connection structure shown in FIG. 8.

Third Embodiment

Figure 10:
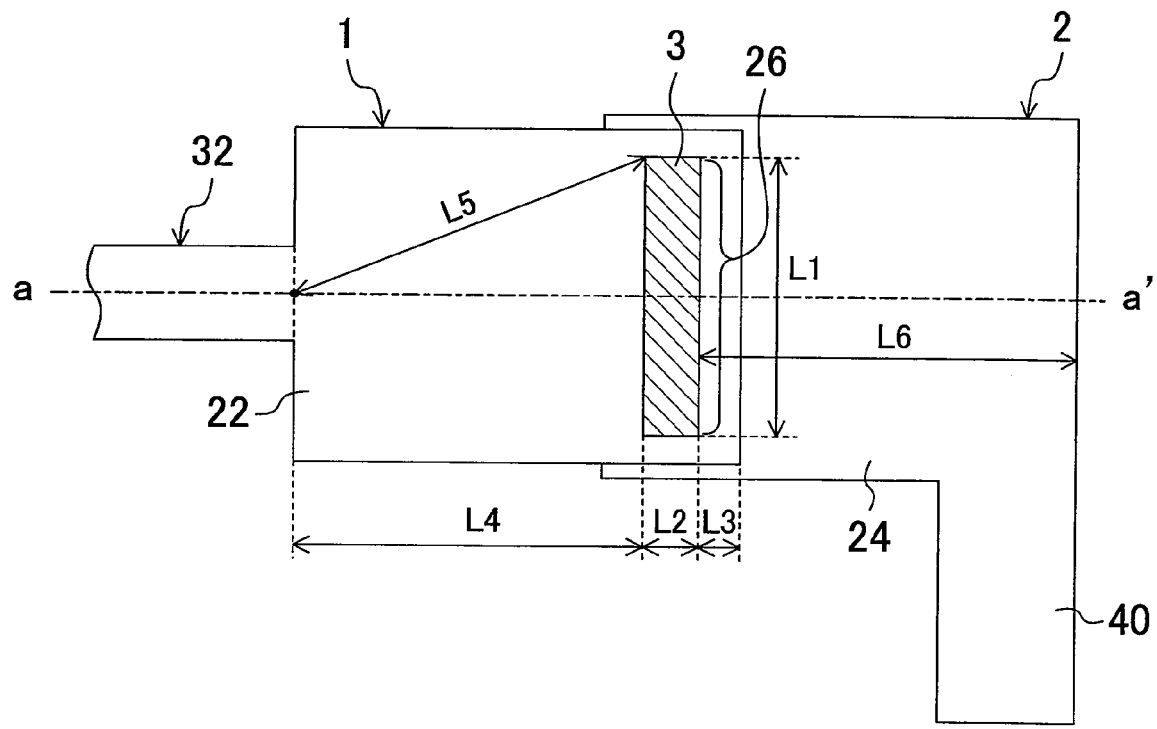
FIG. 10 is a plan view showing a connection structure between two wires provided in vertically-adjacent wiring layers in a semiconductor device according to a third embodiment of the present invention.

FIG. 10 is a plan view showing a connection structure between two wires provided in vertically-adjacent wiring layers in a semiconductor device according to a third embodiment of the present invention. Note that line a-a' in the figure represents the center line of the first wide portion 22 parallel to the transverse direction of the contact formation portion 26.

In the semiconductor device of the present embodiment, the direction of the current flow through the second wide portion 24 is set to be the same as the direction of the current flow through the upper-layer wire 1 (the first wide portion 22), as with the semiconductor device of the first embodiment, but the wire portion 40 is extending in the vertical direction, for example, from a corner portion of the second wide portion 24. That is, the direction in which the second wide portion 24 extends is parallel to the direction in which the first wide portion 22 extends, and they are extending in the opposite transverse directions as viewed from the contact formation portion 26, where the wire portion 32 is extending in the transverse direction of the contact formation portion 26 from the first wide portion 22, whereas the wire portion 40 is extending in the longitudinal direction of the contact formation portion 26 from the second wide portion 24. Where the current flows from the upper-layer wire 1 to the lower-layer wire 2, the current having entered the second wide portion 24 via the contact portion 3 flows through the second wide portion 24 in a direction generally parallel to the first wide portion 22 and then flows from the second wide portion 24 into the wire portion 40 extending in a direction that is bent by 90 degrees, for example. For example, the wire portion 40 is connected to an input/output circuit, etc.

Of the length of the second wide portion 24 (the length of the contact portion 3 in the direction parallel to the transverse direction), the shortest planar distance L6 from one end at which the normal-width wire portion 40 is connected to the contact portion 3 (the contact formation portion 26) may be set to about 15 μm, for example, but it may be changed appropriately depending on the wire resistance of the lower-layer wire 2, etc. Note that the shape of the upper-layer wire 1 is similar to the semiconductor device of the first embodiment, and numerical values and preferred ranges of L1-L5 are also similar to those of the semiconductor device of the first embodiment.

With such a configuration, it is possible to reduce the current concentration at a portion of a side of the contact portion 3 in the transverse direction even in a case where the lower-layer wire 2 cannot be extended straight due to layout limitations. Moreover, the second wide portion 24 having a predetermined length is provided, thereby reducing the current concentration at a side of the contact portion 3 in the longitudinal direction. Therefore, the configuration of the present embodiment can be used irrespective of the relationship between the wire resistance of the lower-layer wire 2 and the wire resistance of the upper-layer wire 1.

Variation of Semiconductor Device of Present Embodiment

Figure 11:
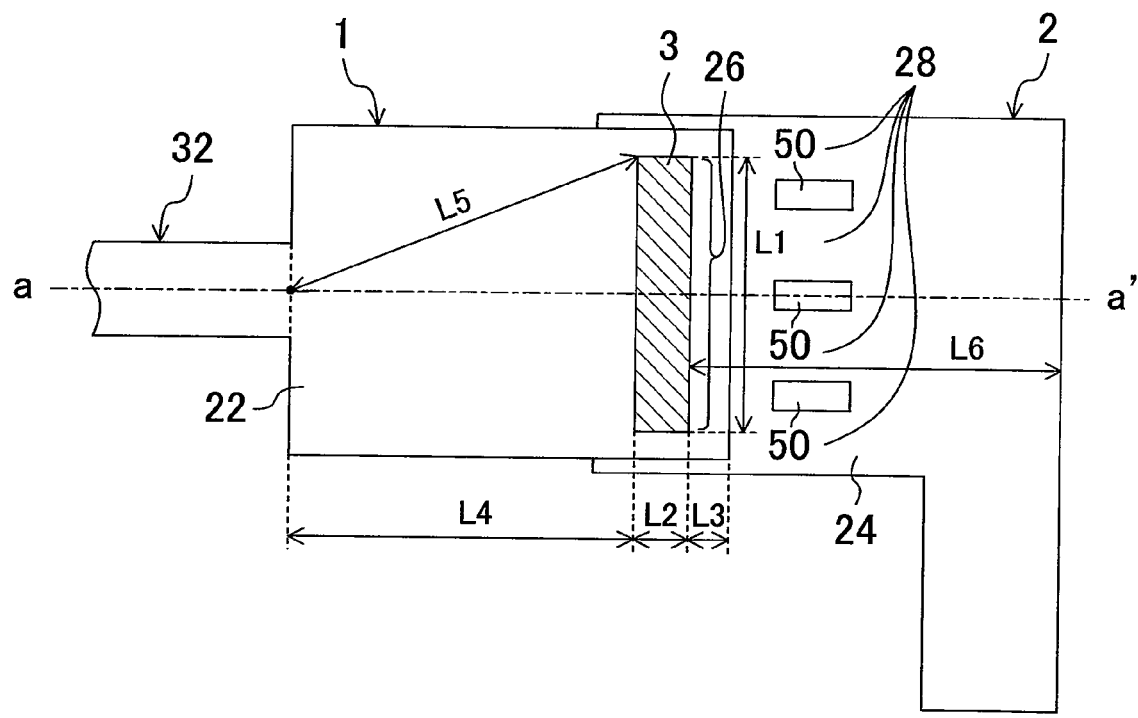
FIG. 11 is a plan view showing a connection structure between two wires provided in vertically-adjacent wiring layers in a semiconductor device according to a variation of the third embodiment.

FIG. 11 is a plan view showing a connection structure between two wires provided in vertically-adjacent wiring layers in a semiconductor device according to a variation of the third embodiment.

In the semiconductor device of this variation, the leading direction of the lower-layer wire 2 from the connecting portion with the contact portion 3 is the same as that of the semiconductor device of the third embodiment, and the lower-layer wire 2 includes the second wide portion 24 having a certain length from the connecting portion with the contact portion 3, and the wire portion 40 bent from the second wide portion 24 by 90 degrees, for example. That is, the direction in which the second wide portion 24 extends is parallel to the direction in which the first wide portion 22 extends, and they are extending in the opposite transverse directions as viewed from the contact formation portion 26, where the wire portion 32 is extending in the transverse direction of the contact formation portion 26 from the first wide portion 22, whereas the wire portion 40 is extending in the longitudinal direction of the contact formation portion 26 from the second wide portion 24. Here, of the length of the second wide portion 24 (the length of the contact portion 3 in the direction parallel to the transverse direction), the length L6 from the contact portion 3 to the end of the second wide portion 24 is about 10 μm, for example.

In this variation, a portion of the second wide portion 24 is divided into a number of (four in the example shown in FIG. 11) wires 28. Specifically, insulating films 50 are arranged, while being spaced apart from one another, in the direction parallel to the longitudinal direction of the contact portion 3 in the current path of the second wide portion 24, and the insulating films 50 divide a portion of the second wide portion 24 into the four wires 28. Where the width of the second wide portion 24 is 49 μm, for example, the width and the length of each wire 28 are 10 μm and 5 μm, respectively, for example.

Where the direction in which the wire portion 40 extends is bent with respect to the direction in which the second wide portion 24 extends, the current is likely to be concentrated at the inner portion of the bent portion because a current tend to flow through a shorter path. With the semiconductor device of this variation, since a portion of the second wide portion 24 is divided into four wires by the insulating films 50, it is possible to reduce the current concentration at the inner portion of the bent portion of the lower-layer wire 2. Therefore, it is possible to reduce the concentration of the current at a portion of the contact portion 3. With such a structure, the length L6 of the second wide portion 24 can be set to be shorter (e.g., it can be shortened by about 5 μm from 15 μm to 10 μm) as compared with the semiconductor device of the third embodiment, and it is therefore possible to reduce the layout area.

Note that in the lower-layer wire 2, insulating films 50 that are closer to the wire portion 40 as viewed from above the substrate may have greater widths than those of insulating films 50 that are further away from the wire portion 40 so as to further reduce the current concentration at the contact portion 3.

Fourth Embodiment

Figure 12:
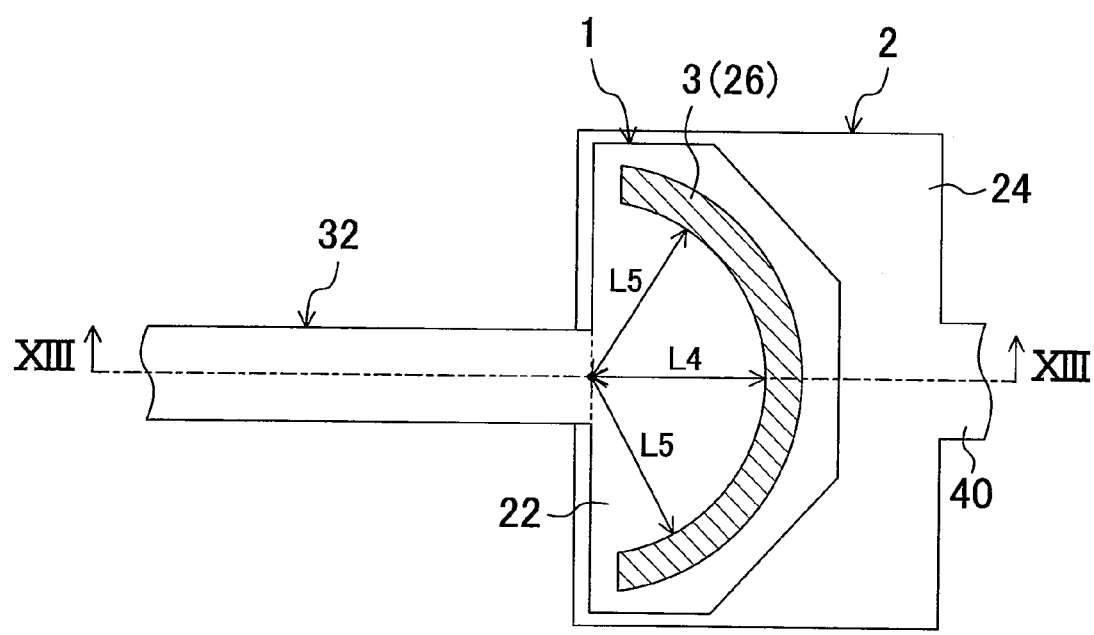
FIG. 12 is a plan view showing a connection structure between two wires provided in vertically-adjacent wiring layers in a semiconductor device according to a fourth embodiment of the present invention.
Figure 13:
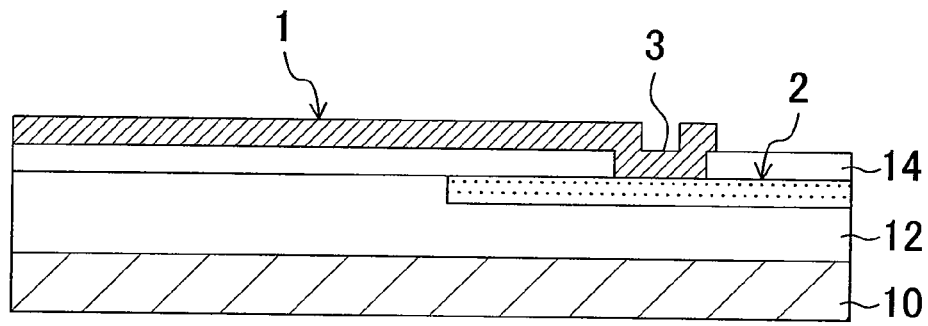
FIG. 13 is a cross-sectional view of the semiconductor device of the fourth embodiment taken along line XIII-XIII of FIG. 12.

FIG. 12 is a plan view showing a connection structure between two wires provided in vertically-adjacent wiring layers in a semiconductor device according to a fourth embodiment of the present invention, and FIG. 13 is a cross-sectional view of the semiconductor device taken along line XIII-XIII of FIG. 12.

In the semiconductor device of the first embodiment, the first wide portion 22, the contact portion 3 and the contact formation portion 26 each have a rectangular planar shape. In the semiconductor device of the present embodiment, the first wide portion 22 has a generally semi-circular planar shape, and the contact portion 3 and the contact formation portion each have an arc-like planar shape. Also in the present embodiment, the contact formation portion 26 has a planar shape of which the length (the width of the contact portion 3) in the direction parallel to the wire width direction of the first wide portion 22 (the vertical direction in FIG. 12) is greater than the length in the direction parallel to the wire length direction of the first wide portion 22 (the length between the opposite ends of the arc formed by the contact portion 3).

With such a configuration, the distance from the center of the boundary between the wire portion 32 and the first wide portion 22 of the upper-layer wire 1 to the contact portion 3 is generally constant irrespective of the position along the contact portion 3. That is, L5=L4 generally holds true. L4 and L5 are 15 μm, for example, and the width of the contact portion 3 is 3-10 μm. Therefore, the current flow through the inner end portion of the contact portion 3 becomes uniform, thereby further improving the reliability of the wire connection via the contact portion 3. Since the planar shape of the first wide portion 22 is semi-circular with no unnecessary corner portions, so as to correspond to the planar shape of the contact portion 3, it is possible to reduce the area required for the wiring.

While the first wide portion 22 has a generally arc-like planar shape in the present embodiment, the first wide portion 22 may have a rectangular planar shape. In such a case, since no current flows through corner portions of the first wide portion 22 that are located outside the arc of the contact portion 3, the corner portions may be left unremoved without influencing the electrical characteristics.

Note that the planar shape of the contact formation portion 26 is not limited to an arc-like shape, but may be an elliptic shape. In such a case, it is preferred that L5 is greater than L4 by a factor of 1 or more and less than 1.7.

Variation of Semiconductor Device of Present Embodiment

Figure 14:
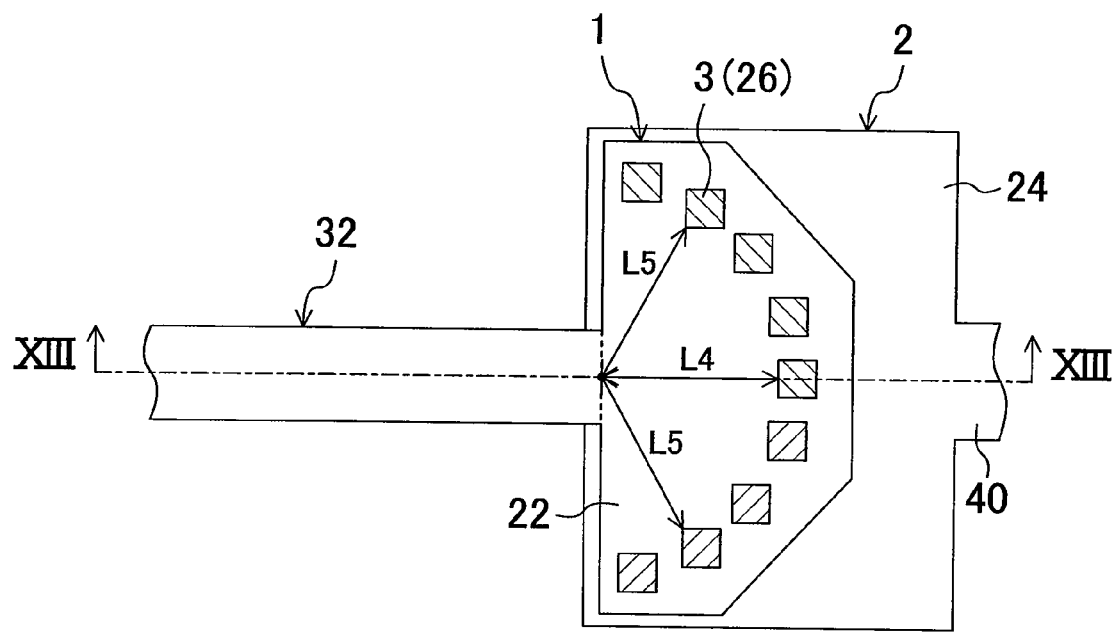
FIG. 14 is a plan view showing a connection structure between two wires provided in vertically-adjacent wiring layers in a semiconductor device according to a variation of the fourth embodiment.
Figure 15:
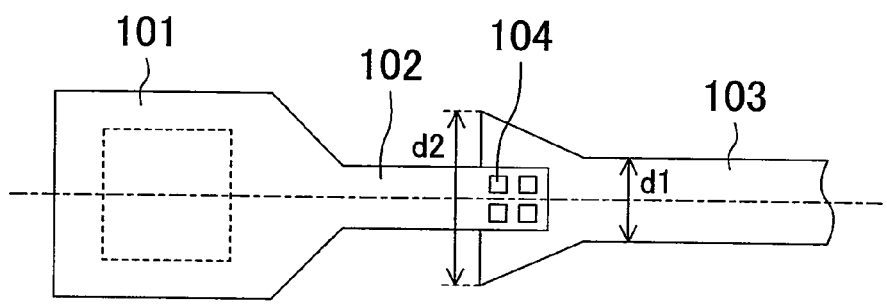
FIG. 15 is a plan view showing a connecting portion between wires provided in different wiring layers in a conventional semiconductor device.

FIG. 14 is a plan view showing a connection structure between two wires provided in vertically-adjacent wiring layers in a semiconductor device according to a variation of the fourth embodiment. The cross section along line XIII-XIII of this variation is similar to that of the semiconductor device of the fourth embodiment shown in FIG. 13.

While the lower-layer wire 2, the first wide portion 22 and the wire portion 32 of the semiconductor device of this variation have the same shapes as those of the semiconductor device of the fourth embodiment, the semiconductor device of this variation differs from the semiconductor device of the fourth embodiment in that a plurality of contact portions 3 each having a generally square planar shape are provided in the contact formation portion 26 having an arc-like planar shape.

In the semiconductor device of this variation, there is a generally equal distance to each of the contact portions 3 from the center of the boundary between the wire portion 32 and the first wide portion 22 of the upper-layer wire 1. That is, L5=L4 generally holds true. L4 and L5 are 15 μm, for example, and the length of one side of the planar shape of the contact portion 3 is 3-10 μm.

With the wire connection structure of this variation, since there is a generally equal distance to each of the contact portions 3 from the center of the boundary between the wire portion 32 and the first wide portion 22 of the upper-layer wire 1, it is possible to pass a current generally uniformly through the contact portions 3. Therefore, it is possible to reduce the concentration of the current at a portion of the contact portion 3 that is facing the boundary between the wire portion 32 and the first wide portion 22 of the upper-layer wire 1, thereby improving the reliability of the electrical connection.

Moreover, since the plurality of contact portions 3 have a square planar shape, the contact portions 3 can share the same shape with contacts provided in circuits on the semiconductor chip. Therefore, by employing a uniform contact size on the semiconductor chip, it is possible to further reduce variations in the shape of the contact.

Note that the scope of the present invention is not limited to the embodiments described above, and the present invention also encompasses examples obtained by, for example, combining wire connection structures of different embodiments with one another as appropriate.

The wire connection configuration according to an example of the present invention described above can be used in a semiconductor device including various circuits in which wires are provided in a plurality of wiring layers.

Given the variety of embodiments of the present invention just described, the above description and illustrations should not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A semiconductor device comprising:
   a first interlayer insulating film provided on a semiconductor substrate;
   a lower-layer wire provided on the first interlayer insulating film;
   a second interlayer insulating film provided on the first interlayer insulating film and the lower-layer wire and including an opening over a portion of the lower-layer wire;
   an upper-layer wire provided on the second interlayer insulating film and including a first wire portion and a first wide portion whose wire width is greater than the first wire portion; and
   a contact formation portion formed in the opening and including at least one contact portion for connecting the lower-layer wire and the first wide portion with each other,
   wherein the contact formation portion has a planar shape of which a length in a direction parallel to a wire width direction of the first wide portion is greater than a length in a direction parallel to a wire length direction of the first wide portion,
   the first wide portion is provided in an end portion of the upper-layer wire, and
   a second distance is greater than a first distance, where the first distance denotes a planar distance between the contact formation portion and a wire end of the upper-layer wire, and the second distance denotes a shortest planar distance from a boundary between the first wire portion and the first wide portion to the contact formation portion.

2. The semiconductor device of claim 1, wherein the upper-layer wire is provided on the second interlayer insulating film, and the contact portion is a portion of the upper-layer wire.

3. The semiconductor device of claim 1, wherein a third distance is less than 1.7 times a second distance, where the second distance denotes a shortest planar distance from a center point of a boundary between the first wire portion and the first wide portion to the contact formation portion, and the third distance denotes a longest planar distance from the center point of the boundary between the first wire portion and the first wide portion to a portion of the contact formation portion that is facing the first wire portion.

4. The semiconductor device of claim 1, wherein a plurality of the contact portions are arranged in the contact formation portion, the contact portions having a generally equal rectangular planar shape.

5. The semiconductor device of claim 1, wherein the contact portion has an octagonal planar shape obtained by chamfering corner portions.

6. The semiconductor device of claim 1, wherein
   a width of the first wide portion is flared toward the contact formation portion from a boundary between the first wide portion and the first wire portion, and
   where a first direction denotes one of opposite wire width directions of the first wide portion, a slope starting from one end point of a boundary between the first wide portion and the first wire portion in the first direction lies outside a line extending from the end point of the boundary between the first wide portion and the first wire portion to one end point of the contact formation portion in the first direction.

7. The semiconductor device of claim 1, wherein the lower-layer wire is connected to a second wire portion and the contact portion and includes a second wide portion whose wire width is greater than the second wire portion.

8. The semiconductor device of claim 1, wherein a direction in which the second wide portion extends is generally parallel to a direction in which the first wide portion extends.

9. The semiconductor device of claim 8, wherein
   the second wire portion is extending in a direction bent from the second wide portion, and
   a portion of the second wide portion is divided into a plurality of wire portions by means of a plurality of insulating films arranged at an interval in the wire width direction.

10. The semiconductor device of claim 1, wherein the contact formation portion has a rectangular planar shape.

11. The semiconductor device of claim 1, wherein the contact formation portion has an arc-like or elliptic planar shape.

12. The semiconductor device of claim 1, wherein a wire resistance of the upper-layer wire is greater than a wire resistance of the lower-layer wire.

13. The semiconductor device of claim 1, wherein
   a plurality of the lower-layer wires are provided on the first interlayer insulating film,
   a plurality of the upper-layer wires are provided on the second interlayer insulating film, each upper-layer wire being connected to a corresponding lower-layer wire via the contact portion, and
   connecting portions between the upper-layer wires each including the first wide portion and the lower-layer wires are arranged in a staggered pattern as viewed from above the semiconductor substrate.

* * * * *